(12) United States Patent
Hsu et al.

(10) Patent No.: US 8,227,917 B2
(45) Date of Patent: Jul. 24, 2012

(54) BOND PAD DESIGN FOR FINE PITCH WIRE BONDING

(75) Inventors: Shih-Hsun Hsu, Hsin-Chu (TW); Hao-Yi Tsai, Hsin-Chu (TW); Benson Liu, Taipei (TW); Chia-Lun Tsai, Hsin-Chu (TW); Hsien-Wei Chen, Sinying (TW); Anbiarshy N. F. Wu, Chiayi (TW); Shang-Yun Hou, Jubei (TW); Shin-Puu Jeng, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 1096 days.

(21) Appl. No.: 11/868,850

(22) Filed: Oct. 8, 2007

(65) Prior Publication Data
US 2009/0091032 A1 Apr. 9, 2009

(51) Int. Cl.
*H01L 23/48* (2006.01)
(52) U.S. Cl. .. 257/738; 257/786; 257/775; 257/E23.021
(58) Field of Classification Search .................. 257/738, 257/786, 775, 48, E23.021
See application file for complete search history.

(56) References Cited

U.S. PATENT DOCUMENTS

| | | | | |
|---|---|---|---|---|
| 5,530,287 A * | 6/1996 | Currie et al. | .................. | 257/692 |
| 5,734,559 A * | 3/1998 | Banerjee et al. | .............. | 361/761 |
| 6,016,256 A * | 1/2000 | Crane et al. | .................... | 361/813 |
| 6,130,484 A * | 10/2000 | Kameda et al. | ............... | 257/786 |
| 6,429,675 B2 * | 8/2002 | Bell | .............................. | 324/765 |
| 6,713,881 B2 * | 3/2004 | Umehara et al. | .............. | 257/786 |
| 6,720,636 B2 * | 4/2004 | Shimizu et al. | ............... | 257/459 |
| 6,900,551 B2 * | 5/2005 | Matsuzawa et al. | .......... | 257/786 |
| 7,064,450 B1 * | 6/2006 | Eghan et al. | .................. | 257/786 |
| 2004/0188848 A1* | 9/2004 | Nojiri et al. | .................... | 257/773 |
| 2007/0035036 A1* | 2/2007 | Sota et al. | ..................... | 257/784 |

FOREIGN PATENT DOCUMENTS

JP   2001-338955 A   12/2001

* cited by examiner

*Primary Examiner* — Thinh T Nguyen
(74) *Attorney, Agent, or Firm* — Slater & Matsil, L.L.P.

(57) ABSTRACT

A bonding pad design is disclosed that includes one or more pad groups on a semiconductor device. Each pad group is made up of two or more bonding pads that have an alternating orientation, such that adjacent bonding pads have their bond ball on opposite sides in relation to the adjacent bonding pad.

11 Claims, 7 Drawing Sheets

BOND PAD DESIGN FOR FINE PITCH WIRE BONDING

TECHNICAL FIELD

The present invention relates, in general, to semiconductor packaging, and more particularly to a bond pad design for fine pitch wire bonding.

BACKGROUND

The semiconductor industry has made great advances in miniaturizing semiconductor chips and devices. However, as these devices get smaller and smaller, there is still the task of connecting the chips and devices into the products for which they have been designed. One method for making such connections is through wire bond pads created on the semiconductor chip/device. Wire bond pads are typically rectangular pad structures that include a bond ball that provides a connection point to the semiconductor device for a wire. Wire bond pads also generally include probe points that allow external probes to check the chip/device for any faults after manufacture.

FIG. 1 is a diagram illustrating bonding structure 10 featuring typical bond pads 100. Bonding structure 10 is shown with four bond pads 100, each having probe mark 101 and bond ball 102 constructed thereon. Wire 103 is shown connected to bond ball 102 and, on the other end, to the host structure (not shown). The pad pitch is generally shown as the distance between the leading edge of one bond pad to the leading edge of the bond ball of the next bond pad.

Currently, the typical minimum wire bond pad pitch is about 50 μm for mass production devices. As technology continues to advance, a greater number of input/output (I/O) pads are desired. However, reducing the size of the bond pads is not the only consideration when designing increased numbers of I/O pads on any given device. In designing a wire bonding process, there are typically three major process parameters that are considered: (1) bonding power; (2) bonding force; and (3) bonding time. Of these three parameters, bonding power is seen as having the most affect on the quality of the resulting bond. Thus, bonding power is generally considered the more important parameter. Typically, there will be an acceptable bonding power range, referred to as the bonding power window, for a particular combination of wire/bond pad dimensions and material. It is generally considered more beneficial to have a wide bonding power window to ensure bonding quality when process variations occur. In practice, it is desirable to achieve a bonding power window in the range of greater than or equal to about a 30% window. Therefore, when considering an increase in the number of I/O pads on any given device, the wire diameter becomes as critical a consideration as the size of the bond pad itself.

Using finer gauge wire generally results in a larger bonding power window. However, finer gauge wire also typically exhibits worse electrical properties than thicker gauges. Therefore, there is a limit to how fine the bonding wire may be that is used for bonding semiconductor devices. In designing smaller bond pad systems for an increased number of I/O pads, an important balance should be maintained between bonding wire gauge and bond pad size in order to maintain an acceptable bonding power window and acceptable electrical properties. This balance is what has provided effective size and gauge limits on modern bonding technology.

SUMMARY OF THE INVENTION

These and other problems are generally solved or circumvented, and technical advantages are generally achieved, by preferred embodiments of the present invention which positions the bonding pads in an alternating orientation, such that the bond balls are on opposite sides of the pads from the adjacent bonding pads. In select embodiments, these bonding pads are stacked, such that two or more connections can be made with bonding wires in the common width of the bonding pads. In other select embodiments, the bonding pad shapes can be formed, such that the bonding pads interlock to form a pad group that has a width that is less than the sum of the bond ball diameters of the bonding pads in the pad group. Again, by reducing the pad pitch, more connections may be facilitated using the same size bonding wire and bond ball diameter.

In accordance with a preferred embodiment of the present invention, a bonding pad design includes one or more pad groups on a semiconductor device. Each pad group is made up of two or more bonding pads that have an alternating orientation, such that adjacent bonding pads have their bond ball on opposite sides in relation to the adjacent bonding pad.

In accordance with another preferred embodiment of the present invention, a method for manufacturing a pad design on a semiconductor device includes placing two or more bonding pads onto the semiconductor device in an alternating orientation, such that a first bond ball location of a first bonding pad is at an opposite end of the first bonding pad from another bond ball location of the adjacent bonding pad.

In accordance with a preferred embodiment of the present invention, a system for binding a semiconductor device to a host device includes one or more pad groups on a semiconductor device that are made up of two or more interlocked non-rectangular bonding pads arranged in alternating orientation. The alternating orientation places the bond ball of each adjacent bonding pad on opposite sides in relation to the other adjacent bonding pad.

An advantage of a preferred embodiment of the present invention is that the pad pitch may be reduced while maintaining the same size of bond ball and wire diameter. In such a configuration more connections may be facilitated for any given semiconductor device while maintaining the same electrical properties of the same size bond balls and wire diameter.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 2:
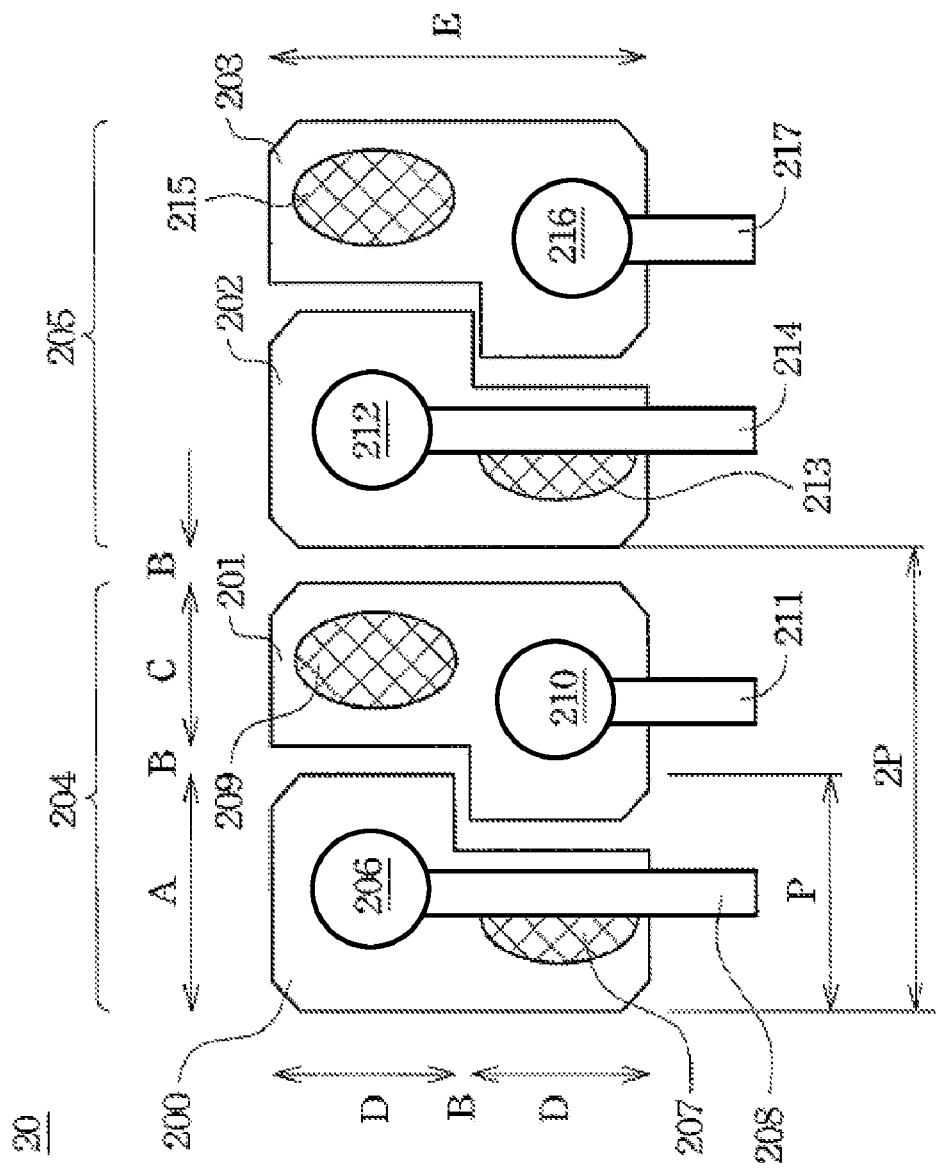
FIG. 2 is a diagram illustrating four bonding pads of a pad design configured according to one embodiment of the present invention.

With reference now to FIG. 2, a diagram is shown illustrating four bonding pads 200-203 of pad design 20 configured according to one embodiment of the present invention. Bonding pads 200-203 include bond balls 206, 210, 212, and 216, respectively, and probe points 207, 209, 213, and 215, respectively. Wires 208, 211, 214, and 217 each connect, respectively, to bond balls 206, 210, 212, and 216, providing electrical connection between the semiconductor device and its host package.

Pad design 20 configures bonding pads 200-203 into two interlocking, alternating-orientation bonding pad pairs, pad pairs 204-205. The interlocking orientation is facilitated by alternating the orientation of bonding pads 200-201 and 202-203. By alternating the orientation, bond balls 206 and 210 are placed at opposite ends of bonding pads 200 and 201 allowing the bond ball side of bonding pad 201 to jut into a cut-out space of the probe point side of bonding pad 200. A similar cut-out in the probe point side of bonding pad 201 allows the bond ball side of bonding pad 200 to jut or "encroach" into the rectangular space or footprint of bonding pad 201. Similar orientation exists with respect to bonding pads 202 and 203. When interlocked, the width of the combination of bonding pads 200 and 201 is less than the sum of the diameters of bond balls 206 and 210. Because the pitch dimension of bonding pads 200-203 is no longer fully restricted by the diameter of bond balls 206, 210, 212, and 216, the size of the pitch dimension can be decreased, which results in increasing the available number of connections or pads per unit length. Moreover, this decrease in overall size comes while maintaining the same size and diameter of the bond balls and bonding wires. Thus, the number of I/O pads may increase while maintaining the balance of electrical performance and bonding power window of the currently-sized bond pads and wires.

It should be noted that FIG. 2 illustrates only four bonding pads of a bonding design that may include hundreds of such bonding pads. The number of bonding pads illustrated herein is limited solely for the purpose of clearly illustrating the inventive aspects of the various embodiments of the present invention. The present invention is not limited to any specific number of bonding pads.

Figure 1:
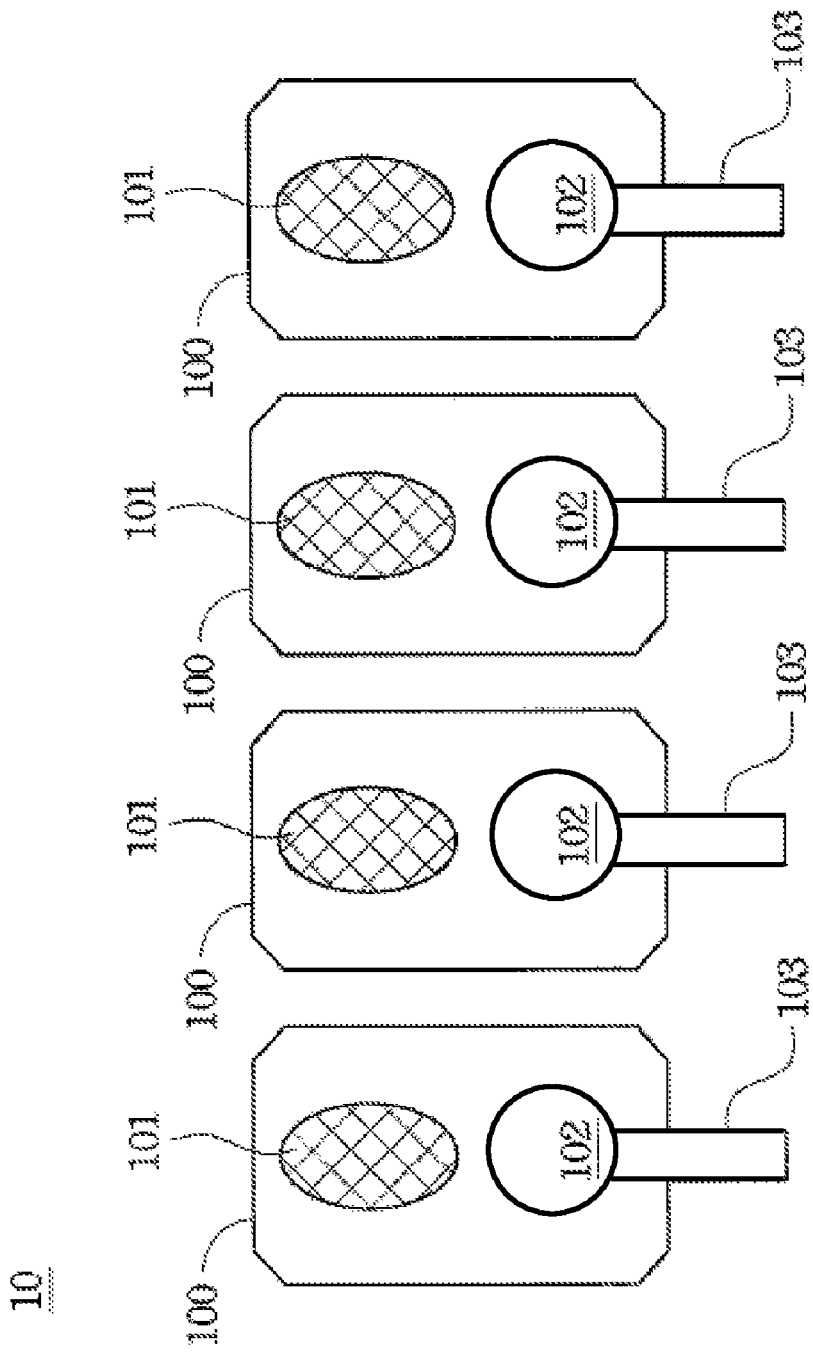
FIG. 1 is a diagram illustrating a bonding structure featuring typical bond pads.

In comparing the dimensions of pad design 20 with bonding structure 10 (FIG. 1), actual exemplary measurements may be assigned to the dimensions solely for the purpose of comparison. For purposes of this example only, the width A equals 32 μm, the width B equals 4 μm, and the width C equals 20 μm. The distance 2 P (i.e., two times the pitch) corresponds to A +B+C+B or 32+4+20+4 which equals 60 μm. Therefore, the pitch, P, equals 30 μm. Using the same whole pad width (i.e., 32 μm) for bonding structure 10 (FIG. 1), the distance 2 P corresponds to 32+4+32+4, which equals 72 μm. Therefore, the pitch, P, of bonding structure 10 (FIG. 1) equals 36 μm. Thus, using the same bond ball and wire dimensions of bonding structure 10 (FIG. 1), the embodiment of the present invention illustrated in FIG. 2 is able to decrease its pad pitch by 6 μm. This represents an entire pad pitch of the prior art configuration of bonding structure 10 (FIG. 1) after only six pad pairs configured according to pad design 20. Because typical implementations include hundreds of such bonding pads, the space savings can be substantial without sacrificing the bonding power window and electrical performance of current bond ball and bonding wire dimensions.

It should be noted that the dimensions used in the previous example are selected purely for demonstration purposes and are not intended to limit the various embodiments of the present invention to any particular size dimensions.

Figure 3:
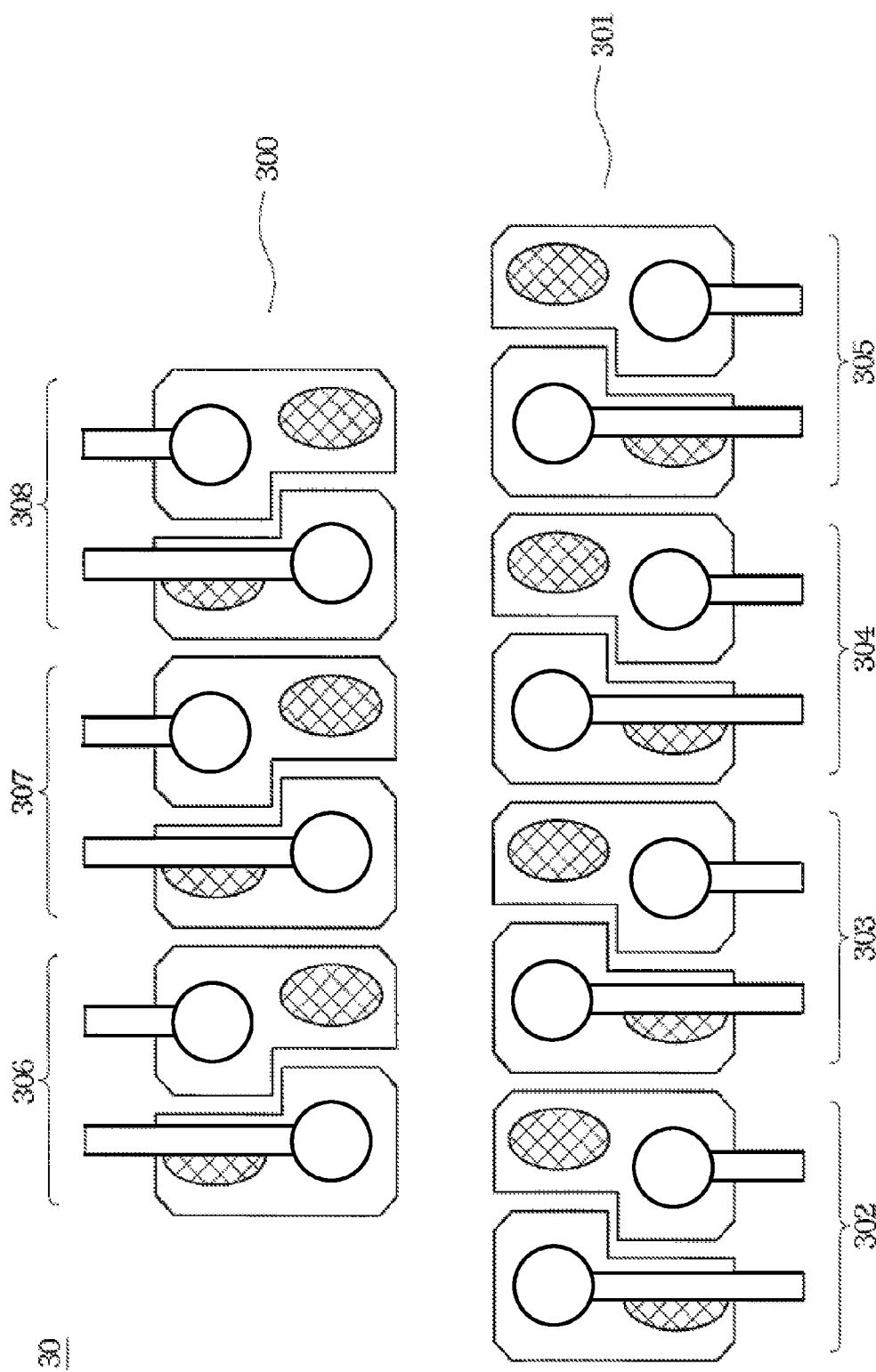
FIG. 3 is a diagram illustrating a pad design configured according to one embodiment of the present invention.

FIG. 3 is a diagram illustrating pad design 30 configured according to one embodiment of the present invention. Pad design 30 illustrates seven interlocking, alternating-orientation pad pairs, pad pairs 302-308, configured in two staggered rows 300 and 301. Pad pairs 302-305 are included in row 301, while pad pairs 306-308 are included in row 300, which is staggered in relation to pad pairs 302-305 of row 301. Wire connections to each of rows 300 and 301 are configured in opposite directions, with the connections for pad pairs 302-305 traveling downward and the connections for pad pairs 306-308 traveling upwards, in relation to the orientation of FIG. 3. Because the pad pitch between each of the bonding pads in pad pairs 302-308 is reduced, more I/O pads may be placed on the semiconductor device using pad design 30. These additional I/O pads are further added without sacrificing the performance characteristics influenced by the wire or bond ball diameter.

Figure 4:
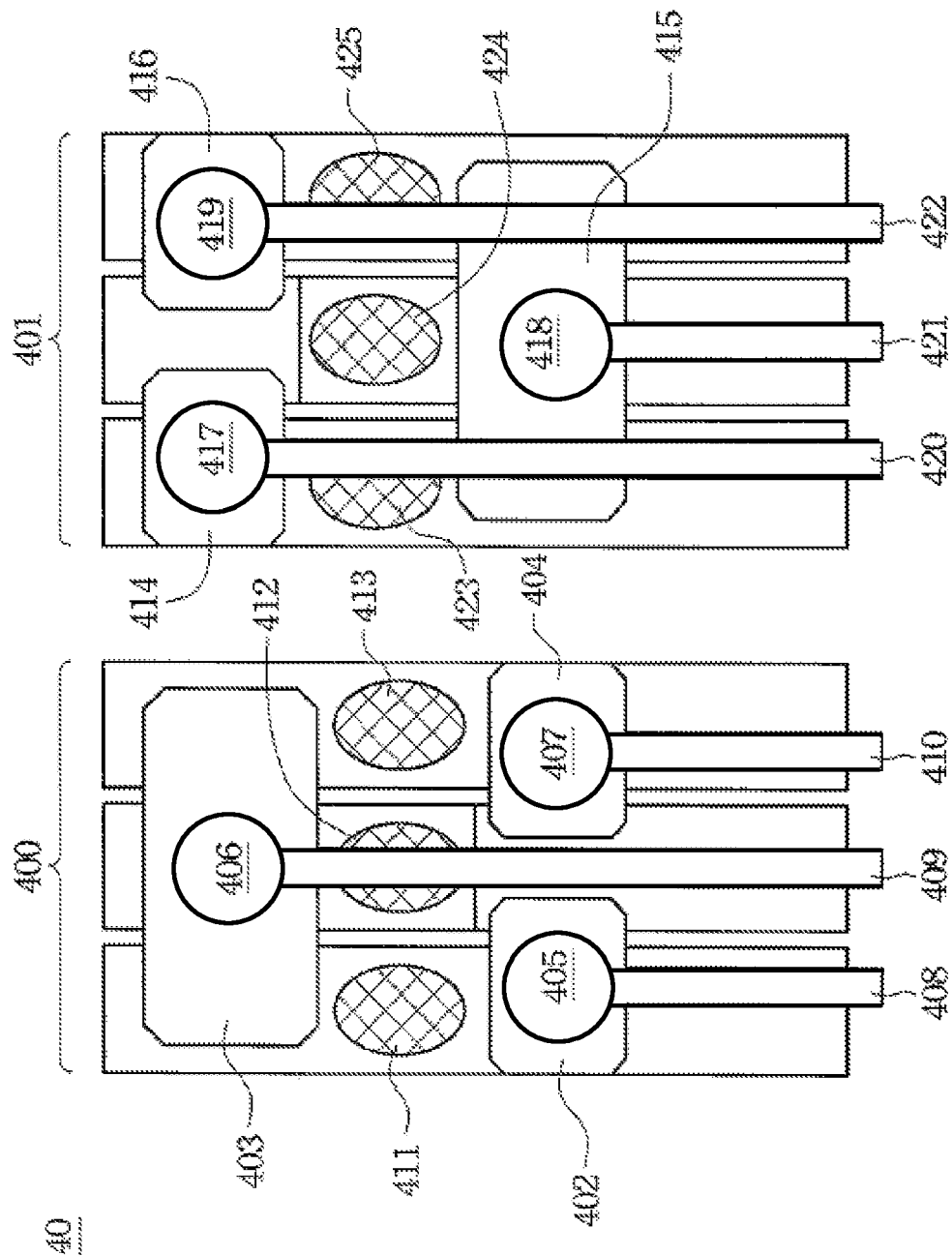
FIG. 4 is a diagram illustrating a pad design configured according to one embodiment of the present invention.

FIG. 4 is a diagram illustrating pad design 40 configured according to one embodiment of the present invention. Pad design 40 provides pad groups 400 and 401, each pad group made up of three interlocking, alternating-orientation and staggered bonding pads. For example, pad group 400 comprises the combination of bonding pads 402-404, in which bonding pad 403 is staggered vertically in relation to bonding pads 402 and 404. The areas on bonding pads 402-404 that include probe marks 411-413, respectively, are fashioned having widths that accommodate the widths of probe marks 411-413, which are less wide than bonding balls, such as bonding balls 405-407. Moreover, because bonding pads 402-404 are alternating orientation, they can be fit together more closely than if bond balls 405-407 were positioned side-by-side. Thus, there is an even smaller distance between wires 408-410, which results in a much smaller pad pitch, and more possible connections within a given unit of length. Pad group 401 has a similar configuration with bonding pads 414-416 interlocked, with alternating orientations of bond balls 417-419. Therefore, the distance between the bonding wires 408-410 and 420-422 is less than a standard configuration of six bonding pads.

The configuration illustrated in FIG. 4 also demonstrates an orientation in which each of probe marks 411-413 and 423-425 are in-line. Having these probe marks in-line facilitates more efficient probing by allowing the probe tips to sequence and probe each bond pad in a straight line. It should be noted that this is only one example configuration of a bond pad design. The present invention is not intended to be limited only to such an in-line probe mark design.

Figure 5:
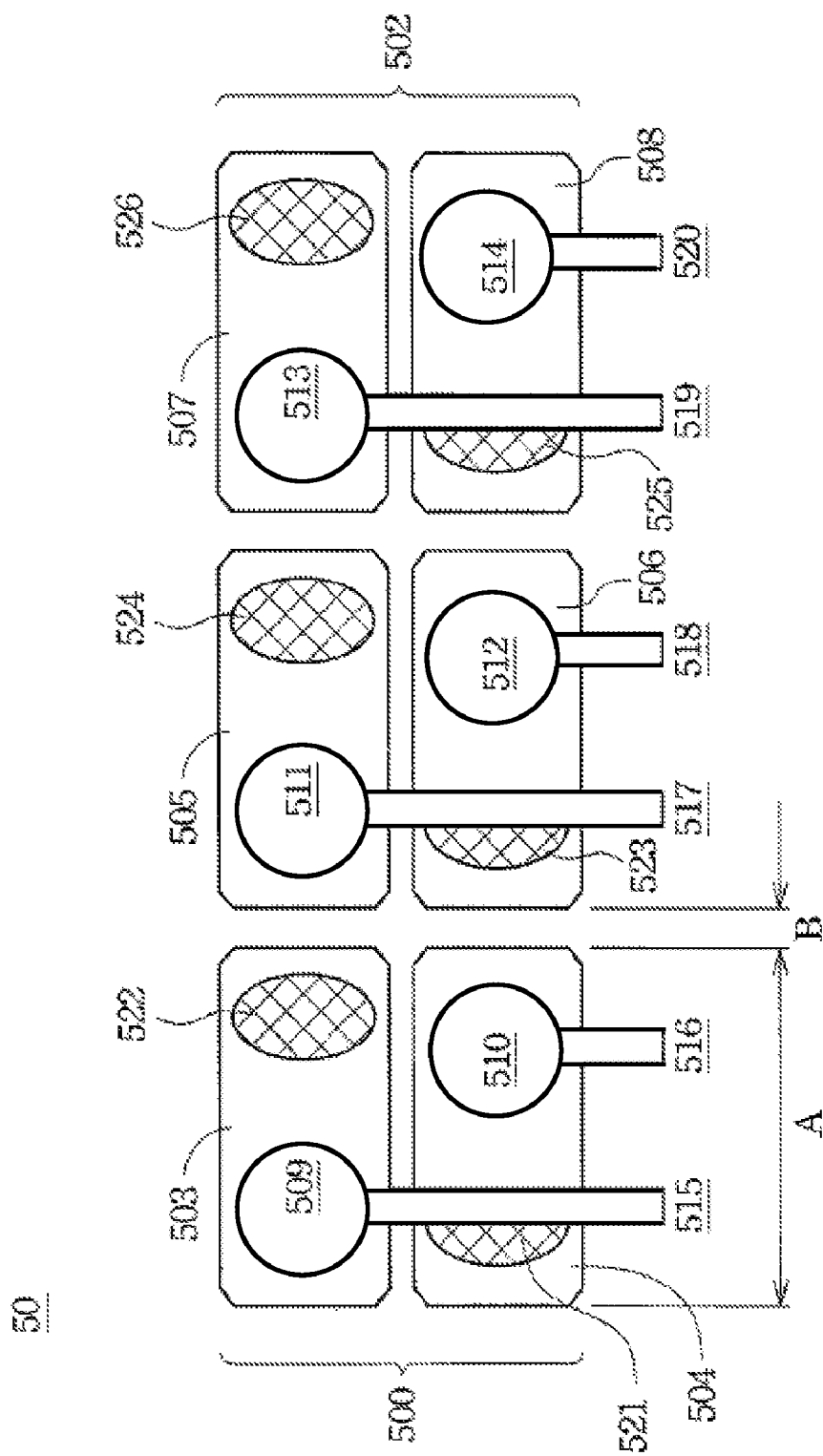
FIG. 5 is a diagram illustrating a pad design configured according to one embodiment of the present invention.

FIG. 5 is a diagram illustrating pad design 50 configured according to one embodiment of the present invention. Instead of decreasing pad pitch and, therefore, increasing connection numbers, pad design 50 configures pad pairs in adjacent, alternating orientation, such as bonding pads 503-508. Pad pairs 500-502 consist of bonding pads 503-504, 505-506, and 507-508, respectively, which are stacked in alternating orientation, such that bond balls 509-510, 511-512, and 513-514 may slightly overlap in a horizontal relation while maintaining a vertical separation. In this orientation, two connections exist within the common length, A, of a single bond pad. The pad pitch, thus, equals half of the sum of the bond pad length and the spacing between the bond pad and the following bond pad in the next pad pair. This is illustrated in FIG. 5 by formula (1):

$$P(\text{Pitch}) = (A+B)/2 \qquad (1)$$

where A represents the bond pad length, and B represents the spacing between consecutive pad pairs.

Figure 6:
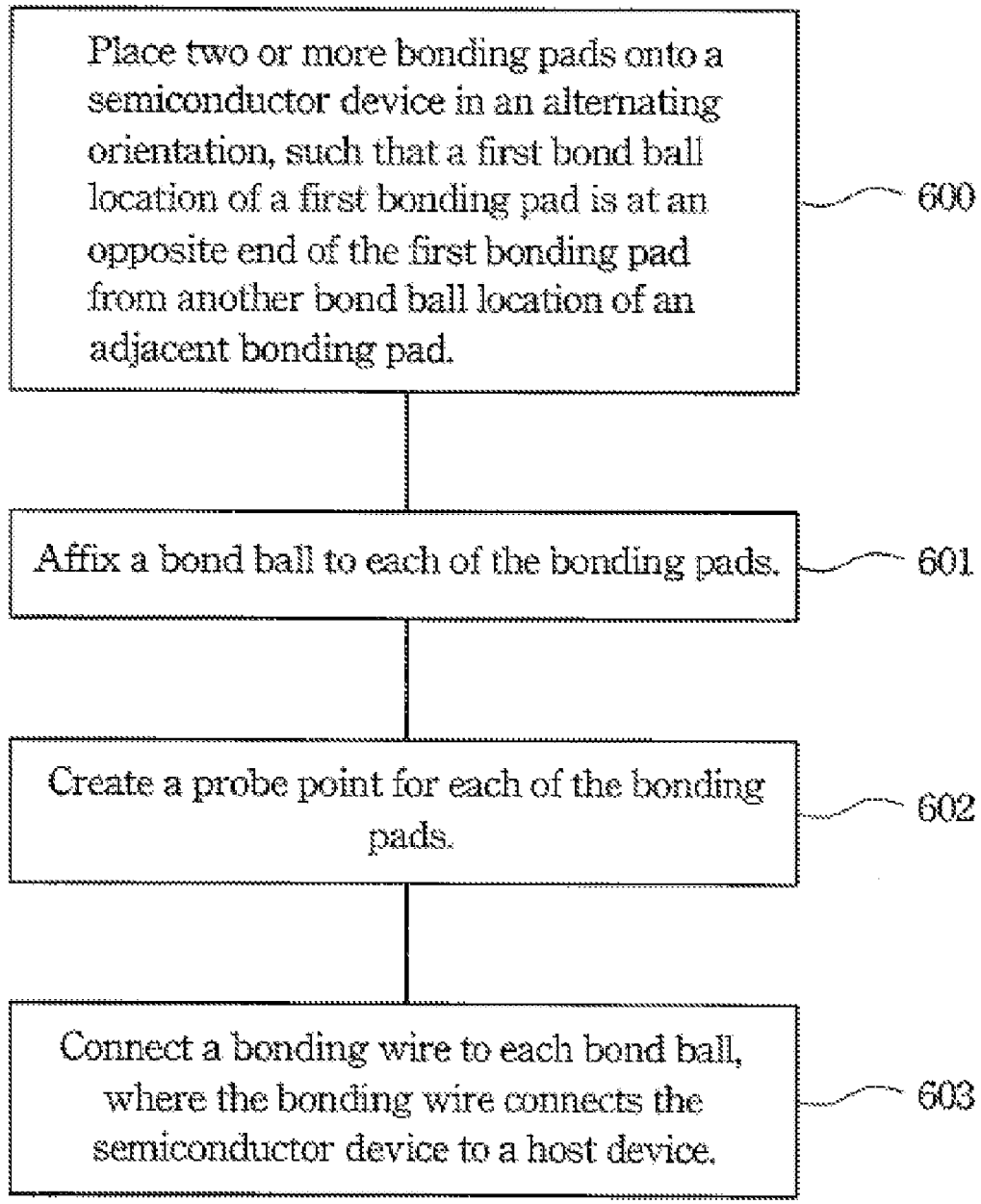
FIG. 6 is a flowchart illustrating example steps executed to implement one embodiment of the present invention.

FIG. 6 is a flowchart illustrating example steps executed to implement one embodiment of the present invention. In step 600, two or more bonding pads are placed onto a semiconductor device in an alternating orientation, such that a first bond ball location of a first bonding pad is at an opposite end of the first bonding pad from another bond ball location of an adjacent bonding pad. A bond ball is affixed to each of the bonding pads in step 601. A probe point is created, in step 602, for each of the bonding pads. In step 603, a bonding wire is connected to each bond ball, where the bonding wire connects the semiconductor device to a host device.

Figure 7:
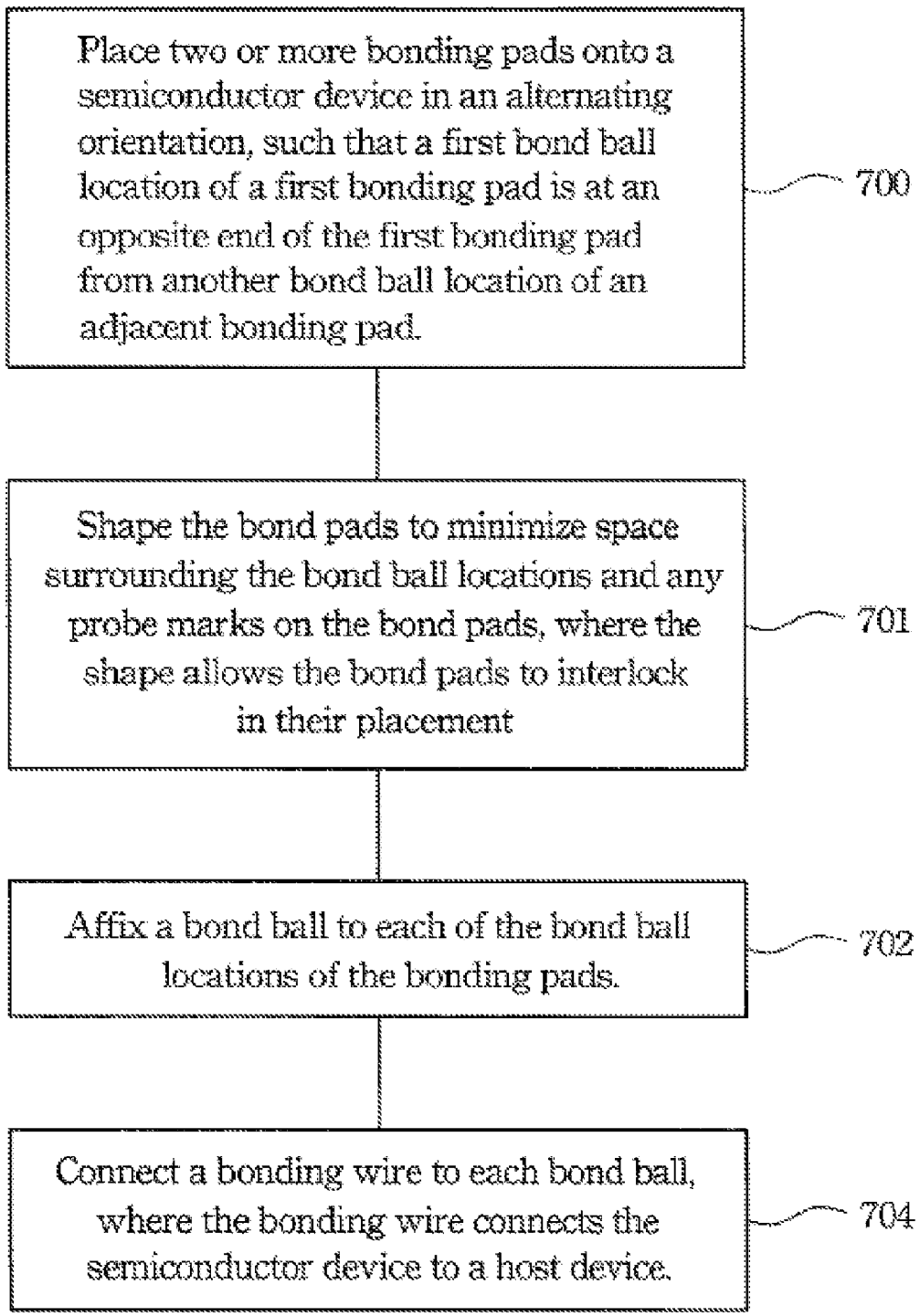
FIG. 7 is a flowchart illustrating example steps executed to implement one embodiment of the present invention.

FIG. 7 is a flowchart illustrating example steps executed to implement one embodiment of the present invention. In step 700, two or more bonding pads are placed onto a semiconductor device in an alternating orientation, such that a first bond ball location of a first bonding pad is at an opposite end of the first bonding pad from another bond ball location of an adjacent bonding pad. The bond pads are shaped, in step 701, to minimize space surrounding the bond ball locations and any probe marks on the bond pads, where the shape allows the bond pads to interlock in their placement. In step 702, a bond ball is affixed to each of the bond ball locations of the bonding pads. A bonding wire is connected, in step 703, to each bond ball, where the bonding wire connects the semiconductor device to a host device.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A bonding pad design comprising:
one or more pad groups on a semiconductor device, said pad groups comprising:
two or more bonding pads, wherein said two or more bonding pads are stacked with a vertical separation in said one or more pad groups and wherein ones of a plurality of bonding wires electrically connected to corresponding bond balls of said stacked two or more bonding pads exist within a horizontal length of a single pad.

2. The bonding pad design of claim 1 further comprising:
a plurality of bonding wires, wherein each one of said plurality of bonding wires is electrically connected to a corresponding bond ball of said two or more bonding pads of said one or more pad groups.

3. The bonding pad design of claim 1 wherein adjacent bonding pads create an interlocking unit, such that a width of said interlocking unit is less than a sum of a diameter of said bond ball of each of said adjacent bonding pads.

4. A bonding pad design comprising:
one or more additional pad groups and one or more pad groups are stacked together, wherein one bonding pad from said one or more additional pad groups shares a horizontal length of a single pad with a corresponding bonding pad from said one or more pad groups; and
a plurality of additional bonding wires, wherein each one of said plurality of additional bonding wires is electrically connected to a corresponding bonding bump of two or more additional bonding pads of said one or more additional pad groups.

5. The bonding pad design of claim 4 wherein said plurality of bonding wires are oriented from said one or more pad groups to connect said semiconductor device from a first side, and wherein said plurality of additional bonding wires are oriented from said one or more additional pad groups to connect said semiconductor device from a second side opposite to said first side.

6. The bonding pad design of claim 4 wherein said plurality of bonding wires and said plurality of additional bonding wires are oriented from said one or more pad groups and said one or more additional pad groups to connect said semiconductor device from a same side, wherein said one or more pad groups and said one or more additional pad groups are staggered, such that said plurality of bonding wires do not overpass said one or more additional pad groups and said plurality of additional bonding wires do not overpass said one or more pad groups.

7. A system for binding a semiconductor device to a host device, said system comprising:
one or more additional pad groups on said semiconductor device and one or more pad groups having two or more bonding are stacked together, wherein one bonding pad from said one or more additional pad groups shares a horizontal length of a single pad with a corresponding bonding pad from said one or more pad groups.

8. The system of claim 7 further comprising:
a plurality of bonding wires, wherein each of said plurality of bonding wires is connected at a first end to a corresponding bond ball on said one or more pad groups or side one or more additional pad groups and is connected at a second end to said host device.

9. The system of claim 7 further comprising:
a probe mark on each of said one or more pad groups and said one or more additional groups, wherein said probe mark is positioned in-line with an adjacent probe mark on an adjacent one of said one or more pad groups and said one or more additional groups.

10. The system of claim 7 wherein a horizontal length of a pad group formed by said one additional pad group and said one pad group is less than a sum of a first horizontal length of said bond ball on said one additional pad group and a second horizontal length of said bond ball on said one pad group.

11. The system of claim 8 further comprising:
one or more additional pad groups on said semiconductor device, wherein said one or more additional pad groups are staggered in relation to said one or more pad groups, and wherein a plurality of additional bonding wires connected to said one or more additional pad groups do not cross over said one or more pad groups and said plurality of bonding wires do not cross over said one or more additional pad groups.

* * * * *